(12) United States Patent
Forbes et al.

(10) Patent No.: US 6,373,740 B1
(45) Date of Patent: Apr. 16, 2002

(54) TRANSMISSION LINES FOR CMOS INTEGRATED CIRCUITS

(75) Inventors: Leonard Forbes, Corvallis, OR (US); Eugene H. Cloud, Boise, ID (US); Kie Y. Ahn, Chappaqua, NY (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/364,199

(22) Filed: Jul. 30, 1999

(51) Int. Cl.$^7$ ................................................. G11C 5/02
(52) U.S. Cl. .......................... 365/51; 333/238; 333/246
(58) Field of Search ............................... 333/238, 246; 174/35 R; 365/51, 63

(56) References Cited

U.S. PATENT DOCUMENTS

| | | | | |
|---|---|---|---|---|
| 3,816,673 A | * | 6/1974 | Miya | 179/170 R |
| 4,308,421 A | * | 12/1981 | Bogese, II | 174/32 |
| 4,933,743 A | | 6/1990 | Thomas et al. | 357/71 |
| 5,165,046 A | | 11/1992 | Hesson | 307/270 |
| 5,510,758 A | * | 4/1996 | Fujita et al. | 333/247 |
| 5,729,047 A | | 3/1998 | Ma | 257/664 |

OTHER PUBLICATIONS

Gabara, T.J., et al., "Digitally Adjustable Resistors in CMOS for High–Performance Applications," *IEEE Journal of Solid–State Circuits*, 27(8), 1176–1185, (1992).

Gunning, B., et al., "A CMOS Low–Voltage–Swing Transmission–Line Transceiver", *Digest of Technical Papers—IEEE International Solid State Circuits Conference*, San Francisco, CA, pp. 58–59, (1992).

Johnson, H.W., et al., "High Speed Digital Design", *A Handbook of Black Magic*, Prentice Hall PTR, Upper Saddle River, New Jersey, pp. 422 & 426, (1993).

Lee, K., "On–Chip interconnects—gigahertz and beyond," *Solid State Technology*, pp. 85–88, (1998).

Lee, K., et al., "Modeling and Analysis of Multichip Module Power Supply Planes", IEEE, pp. 628–639, (1995).

(List continued on next page.)

*Primary Examiner*—Son T. Dinh
(74) *Attorney, Agent, or Firm*—Schwegman, Lundberg, Woessner & Kluth, P.A.

(57) ABSTRACT

Improved methods and structures are provided for impedance-controlled low-loss lines in CMOS integrated circuits. The present invention offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques. Embodiments of a method for forming transmission lines in an integrated circuit include forming a first layer of electrically conductive material on a substrate. A first layer of insulating material is then formed on the first layer of electrically conductive material. The method also includes forming a pair of electrically conductive lines on the first layer of insulating material. Moreover, a transmission line is also formed on the first layer of insulating material. In particular, the transmission line is formed between and parallel with the pair of electrically conductive lines. The method also includes forming a second layer of insulating material on both the transmission line and the pair of electrically conductive lines. A second layer of electrically conductive material is then formed on the second layer of insulating material. One method of the present invention provides transmission lines in an integrated circuit. Another method includes forming transmission lines in a memory device. The present invention includes a transmission line circuit, a differential line circuit, a twisted pair circuit as well as systems incorporating these different circuits all formed according to the methods provided in this application.

33 Claims, 12 Drawing Sheets

OTHER PUBLICATIONS

Rabaey, J.M., *Digital Integrated Circuits, A Design Perspective,* Prentice Hall, Upper Saddle River, New Jersey, ISBN 0–13–178609–1, pp. 482–493, (1996).

Ramo, S., et al., *Fields and Waves in Communication Electronics, Third Edition,* John Wiley & Sons, Inc., pp. 428–433, (1994).

Seevinck, E., et al., "Current–Mode Techniques for High–Speed VLSI Circuits with Application to Current Sense Amplifier for CMOS SRAM's", *IEEE Journal of Solid State Circuits.* 26(4), pp. 525–536, (Apr. 1991).

Thomas, M., et al., "VLSI Multilevel Micro–Coaxial Interconnects for High Speed Devices", IEEE, 4 pages, (1990).

* cited by examiner

TRANSMISSION LINES FOR CMOS INTEGRATED CIRCUITS

FIELD OF THE INVENTION

The present invention relates to integrated circuit devices, and more particularly, to a method and structure for providing novel transmission lines for CMOS integrated circuits.

BACKGROUND OF THE INVENTION

As clocking systems and switching speeds on integrated circuits progress into the GigaHertz (GHz) range and beyond, chip interconnects become more and more critical. Signal delays on transmission lines terminated in their characteristic impedance are of the order of 70 picoseconds per centimeter (ps/cm) when oxide insulators are used. Long signal connections and clock distribution lines operating in the GHz range require the use of low impedance terminated transmission lines for good signal quality and controlled timing skews. These controlled and low impedance lines may not only be terminated at the receiving end by matching impedance but low output impedance drivers may also be used to provide a matching impedance at the sending end of the line.

FIGS. 1A–1C show the classical types of high frequency transmission lines used in microwave, hybrid and printed board circuits for signal interconnections and clock distribution. In FIG. 1A, a coaxial line for use in connecting electronic circuits is illustrated. In particular, FIG. 1A includes a transmission line 102 that is enclosed by an insulator material 104 which in turn is enclosed by a conductive material 106. Additionally, because power supply ringing and substrate bounce are becoming so problematic, metal power supply and ground planes have been incorporated into these types of circuits. FIG. 1B illustrates the incorporation of these power supply and ground planes. Specifically, FIG. 1B includes an insulator material 108. Power supply or ground planes 112A and 112B are deposited on the insulator material 108. Additionally, a transmission line 110 is deposited on the insulator material 108 in between the power supply or ground planes 112A and 112B. The incorporation of these planes reduces power supply transients and bounce associated with inductive and resistive voltage drops in the power supply bus. Similarly, a conductive ground plane, as shown in FIG. 1C, can be used to reduce ground bounce and transient-voltages. In particular, FIG. 1C includes a ground plane 114A and an insulator material 116 deposited on the ground plane 114A. FIG. 1C also includes a transmission line 118 located within the insulator material 116. Additionally, a ground plane 114B is deposited on the insulator material 116. These techniques have resolved problems associated with high frequency transmission lines for microwave, hybrid and printed board circuits. Still, there is a need to provide a solution for these types of problems for CMOS-scaled integrated circuits. Due to the continued reduction in scaling and increases in frequency for transmission lines in integrated circuits such solutions remain a difficult hurdle. For these and other reasons there is a need for the present invention.

SUMMARY OF THE INVENTION

The above mentioned problems with transmission lines in CMOS integrated circuits and other problems are addressed by the present invention and will be understood by reading and studying the following specification. Structures and methods are described which accord improved benefits.

Improved methods and structures are provided for impedance-controlled low-loss transmission lines in CMOS integrated circuits. The present invention offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques.

Embodiments of a method for forming transmission lines in an integrated circuit include forming a first layer of electrically conductive material on a substrate. A first layer of insulating material is then formed on the first layer of electrically conductive material. The method also includes forming a pair of electrically conductive lines on the first layer of insulating material. Moreover, a transmission line is also formed on the first layer of insulating material. In particular, the transmission line is formed between and parallel with the pair of electrically conductive lines. The method also includes forming a second layer of insulating material on both the transmission line and the pair of electrically conductive lines. A second layer of electrically conductive material is then formed on the second layer of insulating material.

One method of the present invention provides transmission lines in an integrated circuit. Another method includes forming transmission lines in a memory device. The present invention includes a transmission line circuit, a differential line circuit, a twisted pair circuit as well as systems incorporating these different circuits all formed according to the methods provided in this application.

These and other embodiments, aspects, advantages, and features of the present invention will be set forth in part in the description which follows, and in part will become apparent to those skilled in the art by reference to the following description of the invention and referenced drawings or by practice of the invention. The aspects, advantages, and features of the invention are realized and attained by means of the instrumentalities, procedures, and combinations particularly pointed out in the appended claims.

DETAILED DESCRIPTION

Figure 1A:
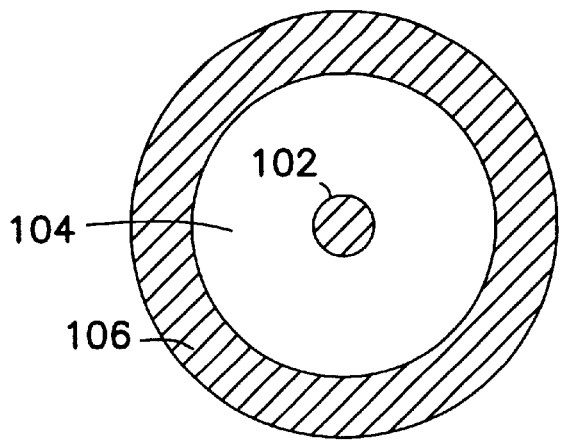
FIGS. 1A–1C show types of high frequency transmission lines used in microwave, hybrid and printed board circuits for signal interconnections and clock distribution.
Figure 1B:
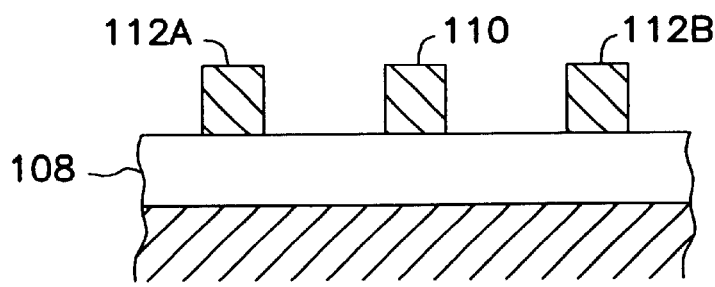
Figure 1C:
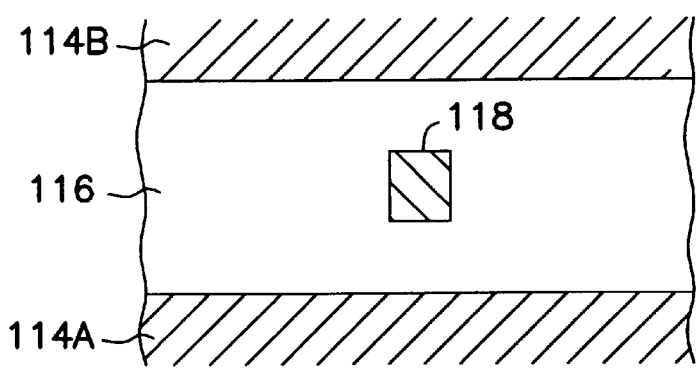

In the following detailed description of the invention, reference is made to the accompanying drawings which form a part hereof, and in which is shown, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention.

The terms wafer and substrate used in the following description include any structure having an exposed surface with which to form the integrated circuit (IC) structure of the invention. The term substrate is understood to include semiconductor wafers. The term substrate is also used to refer to semiconductor structures during processing, and may include other layers that have been fabricated thereupon. Both wafer and substrate include doped and undoped semiconductors, epitaxial semiconductor layers supported by a base semiconductor or insulator, as well as other semiconductor structures well known to one skilled in the art. The term conductor is understood to include semiconductors, and the term insulator is defined to include any material that is less electrically conductive than the materials referred to as conductors. The following detailed description is, therefore, not to be taken in a limiting sense, and the scope of the present invention is defined only by the appended claims, along with the full scope of equivalents to which such claims are entitled.

In particular, an illustrative embodiment of the present invention includes a method for forming transmission lines in an integrated circuit. The method includes forming a first layer of electrically conductive material on a substrate. A first layer of insulating material is then formed on the first layer of electrically conductive material. The method also includes forming a pair of electrically conductive lines on the first layer of insulating material. Moreover, a transmission line is also formed on the first layer of insulating material. In particular, the transmission line is formed between and parallel with the pair of electrically conductive lines. The method also includes forming a second layer of insulating material on both the transmission line and the pair of electrically conductive lines. A second layer of electrically conductive material is then formed on the second layer of insulating material.

Another embodiment of the present invention includes a method for forming integrated circuit lines. This method includes forming a first layer of electrically conductive material on a substrate. A first layer of insulating material is then formed on the first layer of electrically conductive material. The method also includes forming a pair of electrically conductive lines on the first layer of insulating material. Additionally, a pair of integrated circuit lines are formed on the first layer of insulating material. In particular, the pair of integrated circuit lines are formed between and parallel with the pair of electrically conductive lines. The method also includes forming a second layer of insulating material on the pair of integrated circuit lines and the pair of electrically conductive lines. A second layer of electrically conductive material is then formed on the second layer of insulating material.

An alternate method embodiment of the present invention includes forming transmission lines in a memory device. The method includes forming a first layer of electrically conductive material on a substrate. A first layer of insulating material is then formed on the first layer of electrically conductive material. A first pair of electrically conductive lines are then formed on the first layer of insulating material. Moreover, a first transmission line is formed on the first layer of insulating material. In particular, the first transmission line is formed in between and parallel with the first pair of electrically conductive lines. A second layer of insulating material is then formed on the first pair of electrically conductive lines as well as the first transmission line. The method also includes forming a second pair of electrically conductive lines on the second layer of insulating material. Additionally, a second transmission line is formed on the second layer of insulating material. In particular, the second transmission line is formed between and parallel with the second pair of electrically conductive lines and off center with the first transmission line. A third layer of insulating material is then formed on the second pair of electrically conductive lines and the second transmission line. A second layer of electrically conductive material is then formed on the second layer of insulating material.

An apparatus embodiment for the present invention includes a transmission line circuit. The transmission line circuit includes a bottom layer of electrically conductive material formed on a substrate. A layer of insulating material is formed on the bottom layer of the electrically conductive material. Additionally, the transmission line circuit includes a pair of electrically conductive lines formed in the layer of insulating material. A transmission line is also formed on the layer of insulating material. In particular, the transmission line is formed between and parallel with the pair of electrically conductive lines. The transmission line circuit also includes a top layer of electrically conductive material formed on the layer of insulating material.

Another apparatus embodiment of the present invention includes a differential line circuit in a Dynamic Random Access Memory Array (DRAM). The differential line circuit includes a bottom layer of electrically conductive material formed on a substrate. A layer of insulating material is formed on the bottom layer of electrically conductive material. The differential line circuit also includes a pair of electrically conductive lines formed in the layer of insulating material. Additionally, a pair of differential signal lines are formed in the layer of insulating material. In particular, the pair of differential signal lines are formed between and parallel with the pair of electrically conductive lines. The differential line circuit also includes a top layer of electrically conductive material on the layer of insulating material.

Another apparatus embodiment of the present invention includes a twisted differential pair line circuit in a memory device. The twisted differential pair line circuit includes a bottom layer of electrically conductive material formed on a substrate. A layer of insulating material is formed on the bottom layer of electrically conductive material. The twisted differential pair line circuit also includes a first pair of electrically conductive lines formed in the layer of insulating material. A first transmission line is also formed on the layer of insulating material, such that the first transmission line is between and parallel with the first pair of electrically conductive lines. Moreover, the twisted differential pair line circuit includes a second pair of electrically conductive lines formed in the layer of insulating material. A second transmission line is also formed in the layer of insulating material. In particular the second transmission line is formed between and parallel with the second pair of electrically conductive lines and off center with the first transmission line. Additionally, the first transmission line and the second transmission line are twisted around each other. The twisted differential pair line circuit also includes a top layer of electrically conductive material formed on the layer of insulating material.

Another apparatus embodiment of the present invention includes an electronic system. The electronic system includes a processor as well as an integrated circuit coupled to the processor. The integrated circuit includes a bottom layer of electrically conductive material formed on a substrate. A layer of insulating material is formed on the bottom layer of electrically conductive material. The integrated circuit also includes a pair of electrically conductive lines formed in the layer of insulating material. Moreover, a transmission line is formed in the layer of insulating material. In particular, the transmission line is formed between and parallel with the pair of electrically conductive lines. The integrated circuit also includes a top layer of electrically conductive material formed on the layer of insulating material.

Another apparatus embodiment of the present invention includes an electronic system. The electronic system includes a processor as well as a memory chip coupled to the processor through a system bus. The memory chip includes a bottom layer of electrically conductive material formed on a substrate. A layer of insulating material is formed on the bottom layer of electrically conductive material. The memory chip also includes a pair of electrically conductive lines formed in the layer of insulating material. Additionally, a pair of integrated circuit lines is formed in the layer of insulating material. The pair of integrated circuit lines is formed between and parallel with the pair of electrically conductive lines. The memory chip also includes a top layer of electrically conductive material formed on the layer of insulating material.

Another apparatus embodiment of the present invention includes an electronic system. The electronic system includes a processor as well as a Dynamic Random Access Memory (DRAM) coupled to the processor through a system bus. The DRAM includes a bottom layer of electrically conductive material formed on a substrate. A layer of insulating material is formed on the bottom layer of electrically conductive material. The DRAM also includes a first pair of electrically conductive lines formed in the layer of insulating material. Additionally, a first transmission line is formed in the layer of insulating material. The first transmission line is formed between and parallel with the first pair of electrically conductive lines. The DRAM also includes a second pair of electrically conductive lines formed in the layer of insulating material. Moreover, a second transmission line is formed in the layer of insulating material. In particular, the second transmission line is formed between and parallel with the second pair of electrically conductive lines and off center with the first transmission line. Additionally, the first transmission line and the second transmission line are twisted around each other. The DRAM also includes a top layer of electrically conductive material formed on the layer of insulating material.

Another apparatus embodiment of the present invention includes an embedded conductor in an integrated circuit. The apparatus also includes a number of conductive surfaces in the integrated circuit partially encapsulating the embedded conductor.

FIGS. 2A–2F illustrate an embodiment of a process of fabrication of transmission lines in an integrated circuit according to the teachings of the present invention. The sequence of the process can be followed as a method for forming integrated circuit lines and as a method for forming transmission lines in a memory device.

Figure 2A:
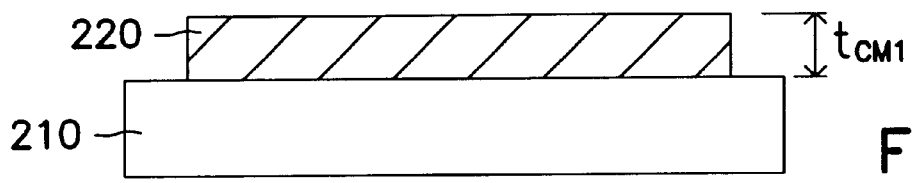
FIGS. 2A–2F illustrate an embodiment of a process of fabrication of transmission lines in an integrated circuit according to the teachings of the present invention.

FIG. 2A shows the structure after the first sequence of processing. A first layer of electrically conductive material 220 is formed on a substrate 210. The first layer of electrically conductive material 220 is formed on the substrate 210 by depositing a conducting film of high conductivity using a technique such as evaporation, sputtering or electroplating. In one embodiment, the first layer of electrically conductive material 220 is a ground plane. In an alternative embodiment, the first layer of electrically conductive material 220 is a power plane. In a further embodiment, the first layer of electrically conductive material 220 has a thickness ($t_{CM1}$) of approximately 3 to 5 micrometers ($\mu$m). In further embodiments, the first layer of electrically conductive material 220 is coupled to a power supply or a ground potential, allowing this layer to function as a direct current (DC) bus. In one embodiment, the first layer of electrically conductive material 220 includes copper. In another embodiment, the first layer of electrically conductive material 220 includes aluminum. In still another embodiment, the first layer of electrically conductive material 220 includes any other suitably conductive material. In one embodiment, the substrate 210 is a bulk semiconductor (e.g., material from the Si, SiGe and GaAs family). In an alternative embodiment, the substrate 210 is an insulator material. In another embodiment, the substrate 210 is a SOI (Silicon-On-Insulator) material.

Figure 2B:
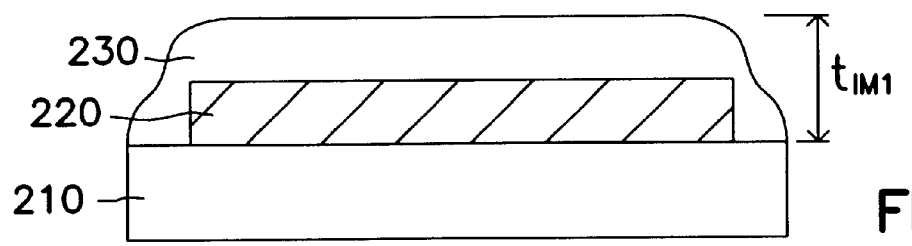

FIG. 2B illustrates the structure following the next sequence of processing. A first layer of insulating material 230 is formed on the first layer of electrically conductive material 220. In one embodiment, the first layer of insulating material 230 is formed by chemical vapor deposition (CVD). In one embodiment, the first layer of insulating material 230 is an oxide layer (e.g., $SiO_2$). In an alternative embodiment, the first layer of insulating material 230 is an insulator with a lower dielectric constant than $SiO_2$. For example, a polyimide, with a dielectric constant, $\in=3$, may be deposited by spin coating followed by curing, if required by electrical design. In one embodiment of FIG. 2B, the first layer of insulating material 230 has a thickness ($t_{Im1}$) of approximately 5 $\mu$m.

Figure 2C:
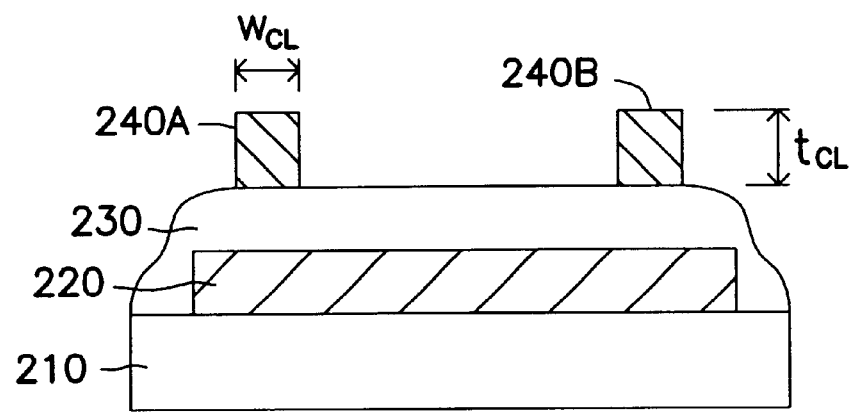

FIG. 2C illustrates the structure following the next sequence of processing. A pair of electrically conductive lines 240A and 240B are formed on the first layer of insulating material 230. In one embodiment, the pair of electrically conductive lines 240A and 240B have a width ($W_{CL}$) of approximately 6 to 10 $\mu$m. In another embodiment, the pair of electrically conductive lines 240A and 240B have a thickness ($t_{CL}$) of approximately 3 $\mu$m. In one embodiment, the pair of electrically conductive lines 240A and 240B are formed using optical lithography followed by an additive metallization, such as lift-off evaporation or electroplating, both of which are low-temperature processing.

Figure 2D:
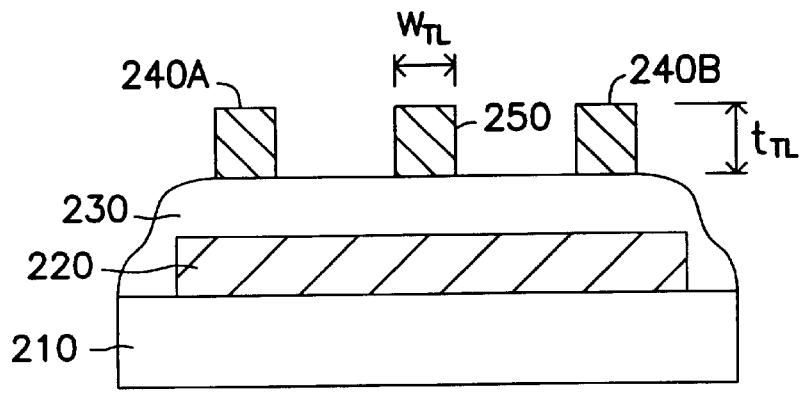

FIG. 2D illustrates the structure following the next sequence of processing. A transmission line 250 is formed on the first layer of insulating material 230. In particular, the transmission line 250 is formed between and in parallel with the pair of electrically conductive lines 240A and 240B. In one embodiment, the transmission line 250 has a width ($W_{TL}$) of approximately 6 to 10 μm. In one embodiment, the transmission line 250 is formed with a thickness ($t_{TL}$) of approximately 3 μm. In one embodiment, the transmission line 250 is formed according to embodiments described in application Ser. No. 09/247,680, entitled "Current Mode Signal Interconnects and CMOS Amplifier," filed on Feb. 9, 1999. Similar to the processing of FIG. 2C, the transmission line 250 can be formed using optical lithography followed by an additive metallization, such as lift-off evaporation or electroplating, both of which are low-temperature processing.

Figure 2E:
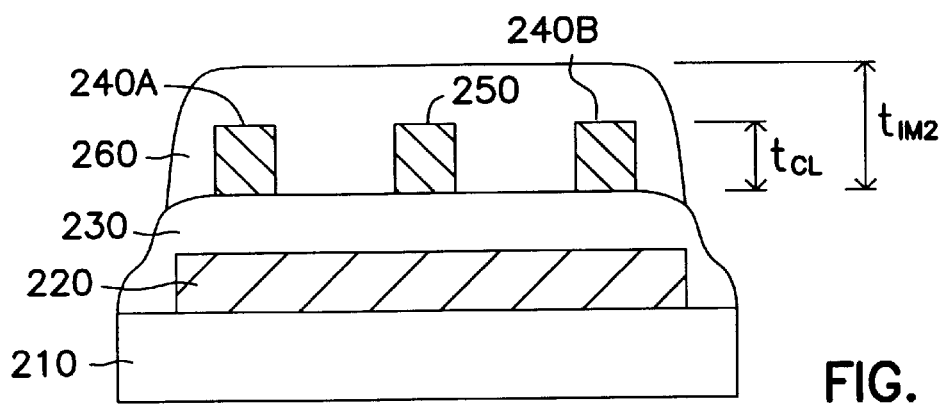

FIG. 2E illustrates the structure following the next sequence of processing. A second layer of insulating material 260 is formed on the pair of electrically conductive lines 240A and 240B and the transmission line 250. In one embodiment, the second layer of insulating material 260 is formed by chemical vapor deposition (CVD). In one embodiment, the second layer of insulating material 260 is an oxide layer (e.g., $SiO_2$). In an alternative embodiment, the second layer of insulating material 260 is an insulator with a lower dielectric constant than $SiO_2$. For example, a polyimide, with a dielectric constant, $\in=3$, may be deposited by spin coating followed by curing, if required by electrical design. In one embodiment of FIG. 2E, the second layer of insulating material 260 has a thickness ($t_{IM2}$) which is at least 50% greater than a thickness ($t_{CL}$) of the pair of electrically conductive lines 240A and 240B and the transmission line 250. Advantageously, this level of thickness insures step coverage at the conductor corners.

Figure 2F:
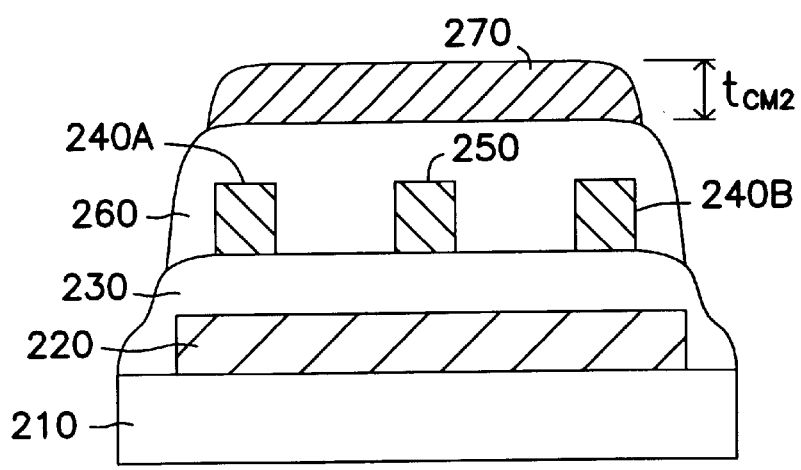

FIG. 2F illustrates the structure following the next sequence of processing. A second layer of electrically conductive material 270 is formed on the second layer of insulating material 260. The second layer of electrically conductive material 270 is formed on the second layer of insulating material 260 by depositing a conducting film of high conductivity using a technique such as evaporation, sputtering or electroplating. In one embodiment, the second layer of electrically conductive material 270 is a ground plane. In an alternative embodiment, the second layer of electrically conductive material 270 is a power plane. In a further embodiment, the second layer of electrically conductive material 270 has a thickness ($t_{CM2}$) of approximately 3 to 5 micrometers (μm). In further embodiments, the second layer of electrically conductive material 270 is coupled to a power supply or a ground potential, allowing this layer to function as a direct current (DC) bus. In one embodiment, the second layer of electrically conductive material 270 includes copper. In another embodiment, the second layer of electrically conductive material 270 includes aluminum. In still another embodiment, the second layer of electrically conductive material 270 includes any other suitably conductive material.

FIGS. 3A–3F illustrate an embodiment of a process of fabrication of transmission lines in an integrated circuit according to the teachings of the present invention. The sequence of the process can be followed as a method for forming integrated circuit lines and as a method for forming transmission lines in a memory device.

Figure 3A:
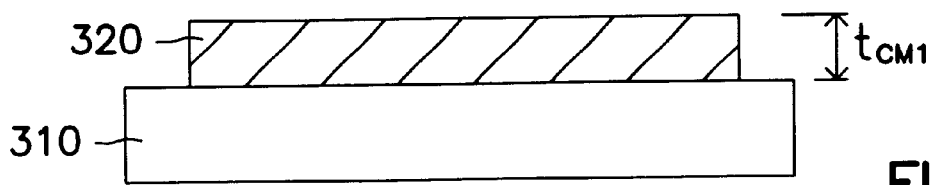
FIGS. 3A–3F illustrate an alternate embodiment of a process of fabrication of transmission lines in an integrated circuit according to the teachings of the present invention.

FIG. 3A shows the structure after the first sequence of processing. A first layer of electrically conductive material 320 is formed on a substrate 310. The first layer of electrically conductive material 320 is formed on the substrate 310 by depositing a conducting film of high conductivity using a technique such as evaporation, sputtering or electroplating. In one embodiment, the first layer of electrically conductive material 320 is a ground plane. In an alternative embodiment, the first layer of electrically conductive material 320 is a power plane. In a further embodiment, the first layer of electrically conductive material 320 has a thickness ($t_{CM1}$) of approximately 3 to 5 micrometers (μm). In further embodiments, the first layer of electrically conductive material 320 is coupled to a power supply or a ground potential, allowing this layer to function as a direct current (DC) bus. In one embodiment, the first layer of electrically conductive material 320 includes copper. In another embodiment, the first layer of electrically conductive material 320 includes aluminum. In still another embodiment, the first layer of electrically conductive material 320 includes any other suitably conductive material. In one embodiment, the substrate 310 is a bulk semiconductor (e.g., material from the Si, SiGe and GaAs family). In an alternative embodiment, the substrate 310 is an insulator material. In another embodiment, the substrate 310 is a SOI (Silicon-On-Insulator) material.

Figure 3B:
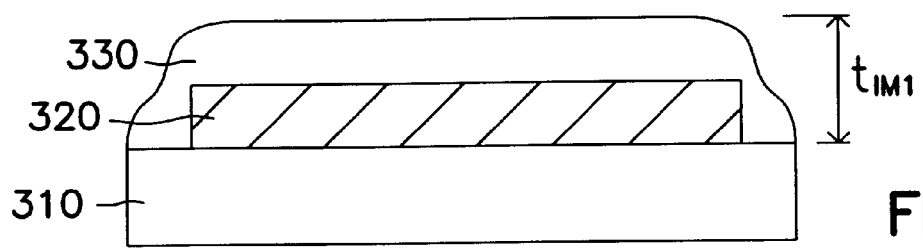

FIG. 3B illustrates the structure following the next sequence of processing. A first layer of insulating material 330 is formed on the first layer of electrically conductive material 320. In one embodiment, the first layer of insulating material 330 is formed by chemical vapor deposition (CVD). In one embodiment, the first layer of insulating material 330 is an oxide layer (e.g., $SiO_2$). In an alternative embodiment, the first layer of insulating material 330 is an insulator with a lower dielectric constant than $SiO_2$. For example, a polyimide, with a dielectric constant, $\in=3$, may be deposited by spin coating followed by curing, if required by electrical design. In one embodiment of FIG. 3B, the first layer of insulating material 330 has a thickness ($t_{IM1}$) of approximately 5 μm.

Figure 3C:
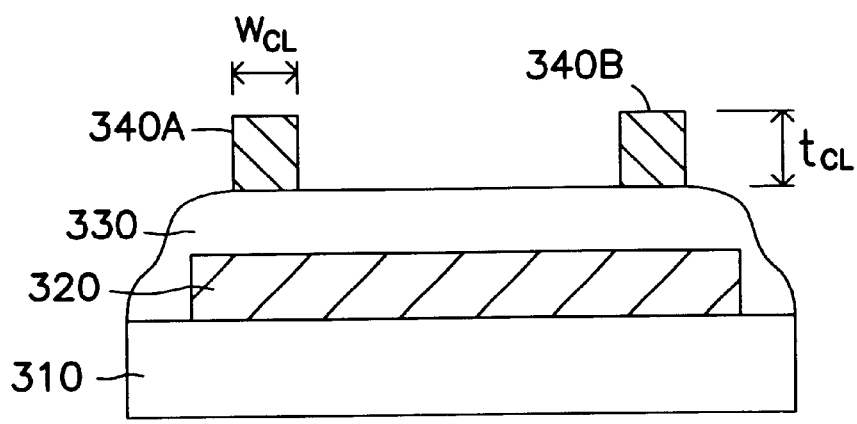

FIG. 3C illustrates the structure following the next sequence of processing. A pair of electrically conductive lines 340A and 340B are formed on the first layer of insulating material 330. In one embodiment, the pair of electrically conductive lines 340A and 340B have a width ($W_{CL}$) of approximately 6 to 10 μm. In another embodiment, the pair of electrically conductive lines 340A and 340B have a thickness ($t_{CL}$) of approximately 3 μm. In one embodiment, the pair of electrically conductive lines 340A and 340B are formed using optical lithography followed by an additive metallization, such as lift-off evaporation or electroplating, both of which are low-temperature processing.

Figure 3D:
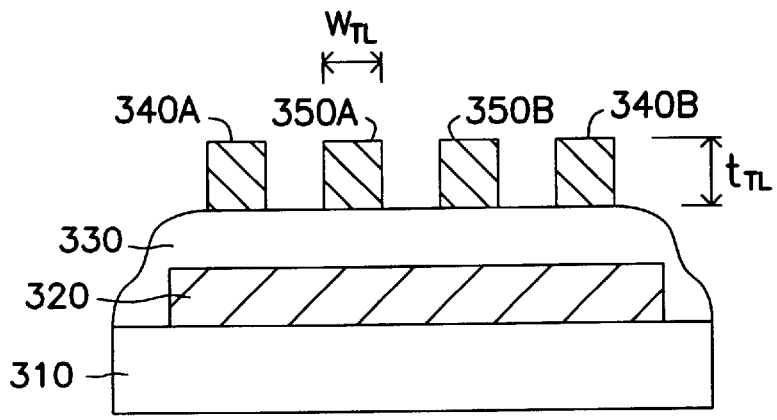

FIG. 3D illustrates the structure following the next sequence of processing. A pair of transmission lines 350A and 350B are formed on the first layer of insulating material 330. In particular, the pair of transmission lines 350A and 350B are formed between and parallel with the pair of electrically conductive lines 340A and 340B. In one embodiment, the pair of transmission lines 350A and 350B have a width ($W_{TL}$) of approximately 6 to 10 μm. In one embodiment, the pair of transmission lines 350A and 350B are formed with a thickness ($t_{TL}$) of approximately 3 μm. In one embodiment, the pair of transmission lines 350A and 350B are formed according to embodiments described in application Ser. No. 09/247,680, entitled "Current Mode Signal Interconnects and CMOS Amplifier," filed on Feb. 9, 1999. Similar to the processing of FIG. 3C, the pair of transmission lines 350A and 350B can be formed using optical lithography followed by an additive metallization, such as lift-off evaporation or electroplating, both of which are low-temperature processing.

Figure 3E:
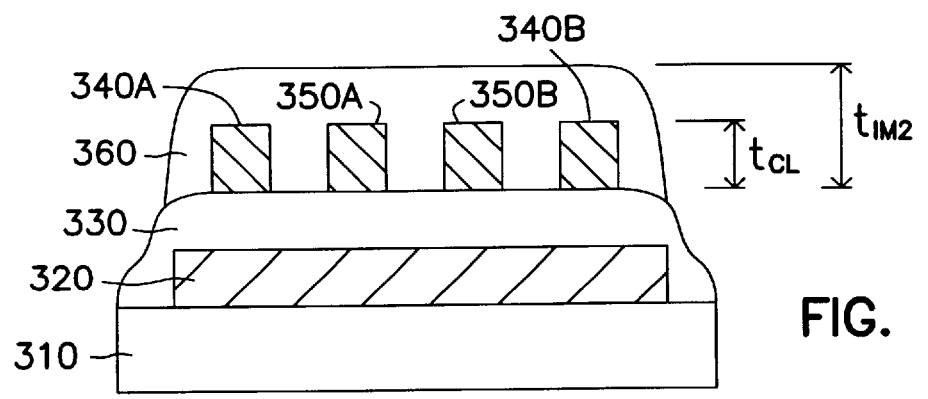

FIG. 3E illustrates the structure following the next sequence of processing. A second layer of insulating material 360 is formed on the pair of electrically conductive lines 340A and 340B and the pair of transmission lines 350A and 350B. In one embodiment, the second layer of insulating material 360 is formed by chemical vapor deposition (CVD). In one embodiment, the second layer of insulating material 360 is an oxide layer (e.g., $SiO_2$). In an alternative embodiment, the second layer of insulating material 360 is an insulator with a lower dielectric constant than $SiO_2$. For example, a polyimide, with a dielectric constant, $\in=3$, may be deposited by spin coating followed by curing, if required by electrical design. In one embodiment of FIG. 3E, the second layer of insulating material 360 has a thickness ($t_{IM2}$) which is at least 50% greater than a thickness ($t_{CL}$) of the pair of electrically conductive lines 340A and 340B and the pair of transmission lines 350A and 350B. Advantageously, this level of thickness insures step coverage at the conductor corners.

Figure 3F:
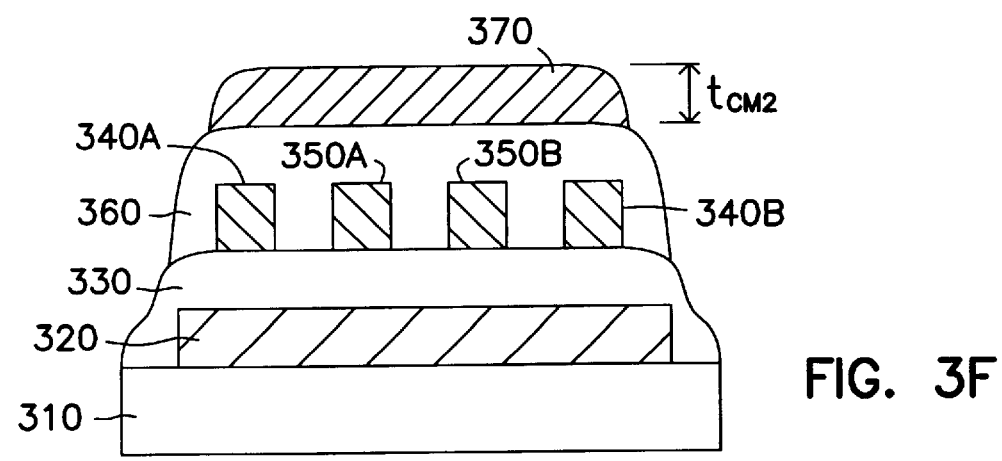

FIG. 3F illustrates the structure following the next sequence of processing. A a second layer of electrically conductive material 370 is formed on the second layer of insulating material 360. The second layer of electrically conductive material 370 is formed on the second layer of insulating material 360 by depositing a conducting film of A high conductivity using a technique such as evaporation, sputtering or electroplating. In one embodiment, the second layer of electrically conductive material 370 is a ground plane. In an alternative embodiment, the second layer of electrically conductive material is a power plane. In a further embodiment, the second layer of electrically conductive material 370 has a thickness ($t_{CM2}$) of approximately 3 to 5 micrometers (μm). In further embodiments, the second layer of electrically conductive material 370 is coupled to a power supply or a ground potential, allowing this layer to function as a direct current (DC) bus. In one embodiment, the second layer of electrically conductive material 370 includes copper. In another embodiment, the second layer of electrically conductive material 370 includes aluminum. In still another embodiment, the second layer of electrically conductive material 370 includes any other suitably conductive material.

FIGS. 4A–4I illustrate an embodiment of a process of fabrication of transmission lines in an integrated circuit according to the teachings of the present invention. The sequence of the process can be followed as a method for forming integrated circuit lines and as a method for forming transmission lines in a memory device.

Figure 4A:
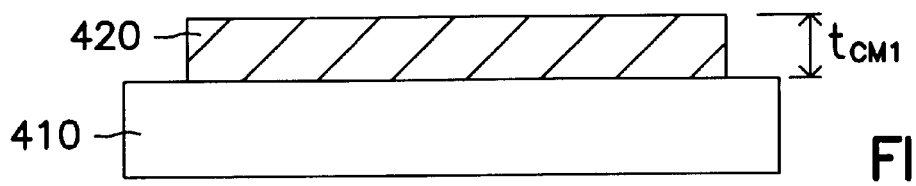
FIGS. 4A–4I illustrate an another embodiment of a process of fabrication of transmission lines in an integrated circuit according to the teachings of the present invention.

FIG. 4A shows the structure after the first sequence of processing. A first layer of electrically conductive material 420 is formed on a substrate 410. The first layer of electrically conductive material 420 is formed on the substrate 410 by depositing a conducting film of high conductivity using a technique such as evaporation, sputtering or electroplating. In one embodiment, the first layer of electrically conductive material 420 is a ground plane. In an alternative embodiment, the first layer of electrically conductive material 420 is a power plane. In a further embodiment, the first layer of electrically conductive material 420 has a thickness ($t_{CM1}$) of approximately 3 to 5 micrometers (μm). In further embodiments, the first layer of electrically conductive material 420 is coupled to a power supply or a ground potential, allowing this layer to function as a direct current (DC) bus. In one embodiment, the first layer of electrically conductive material 420 includes copper. In another embodiment, the first layer of electrically conductive material 420 includes aluminum. In still another embodiment, the first layer of electrically conductive material 420 includes any other suitably conductive material. In one embodiment, the substrate 410 is a bulk semiconductor (e.g., material from the Si, SiGe and GaAs family). In an alternative embodiment, the substrate 410 is an insulator material. In another embodiment, the substrate 410 is a SOI (Silicon-On-Insulator) material.

Figure 4B:
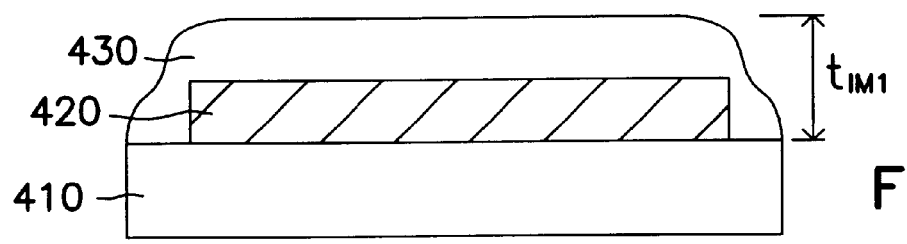

FIG. 4B illustrates the structure following the next sequence of processing. A first layer of insulating material 430 is formed on the first layer of electrically conductive material 420. In one embodiment, the first layer of insulating material 430 is formed by chemical vapor deposition (CVD). In one embodiment, the first layer of insulating material 430 is an oxide layer (e.g., $SiO_2$). In an alternative embodiment, the first layer of insulating material 430 is an insulator with a lower dielectric constant than $SiO_2$. For example, a polyimide, with a dielectric constant, $\in=3$, may be deposited by spin coating followed by curing, if required by electrical design. In one embodiment of FIG. 4B, the first layer of insulating material 430 has a thickness ($t_{IM1}$) of approximately 5 μm.

Figure 4C:
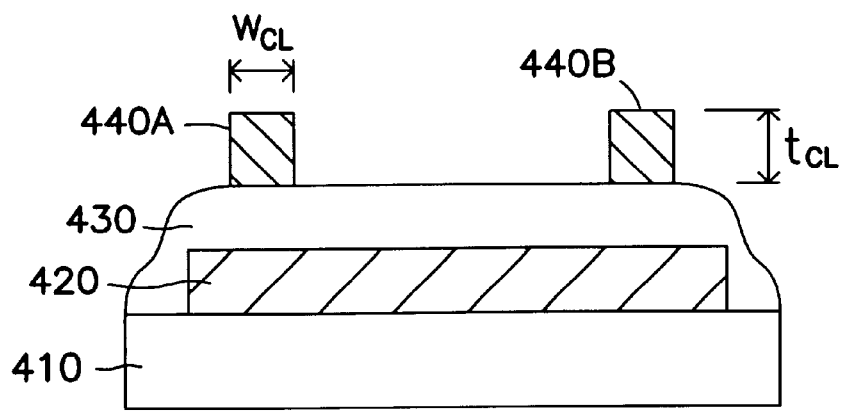

FIG. 4C illustrates the structure following the next sequence of processing. A first pair of electrically conductive lines 440A and 440B is formed on the first layer of insulating material 430. In one embodiment, the first pair of electrically conductive lines 440A and 440B have a width ($W_{CL}$) of approximately 6 to 10 μm. In another embodiment, the first pair of electrically conductive lines 440A and 440B have a thickness ($t_{CL}$) of approximately 3 μm. In one embodiment, the first pair of electrically conductive lines 440A and 440B are formed using optical lithography followed by an additive metallization, such as lift-off evaporation or electroplating, both of which are low-temperature processing.

Figure 4D:
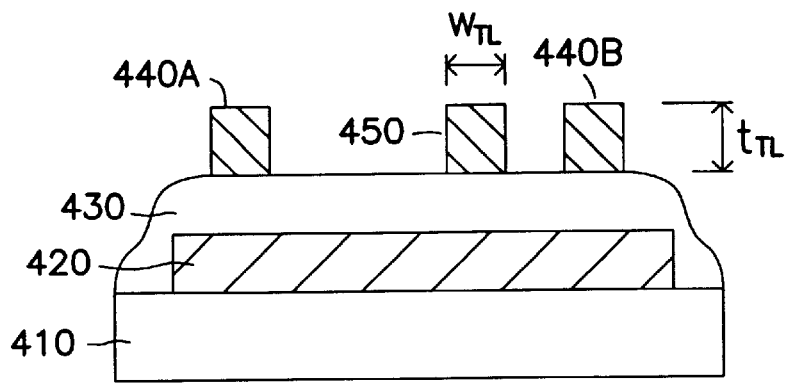

FIG. 4D illustrates the structure following the next sequence of processing. A first transmission line 450 is formed on the first layer of insulating material 430. In particular, the first transmission line 450 is formed between and in parallel with the first pair of electrically conductive lines 440A and 440B. In one embodiment, the first transmission line 450 has a width ($W_{TL}$) of approximately 6 to 10 μm. In another embodiment, the first transmission line 450 has a thickness ($t_{TL}$) of approximately 3 μm. In one embodiment, the first transmission line 450 is formed according to embodiments described in application Ser. No. 09/247,680, entitled "Current Mode Signal Interconnects and CMOS Amplifier," filed on Feb. 9, 1999. Similar to the processing of FIG. 4C, the first transmission line 450 can be formed using optical lithography followed by an additive metallization, such as lift-off evaporation or electroplating, both of which are low-temperature processing.

Figure 4E:
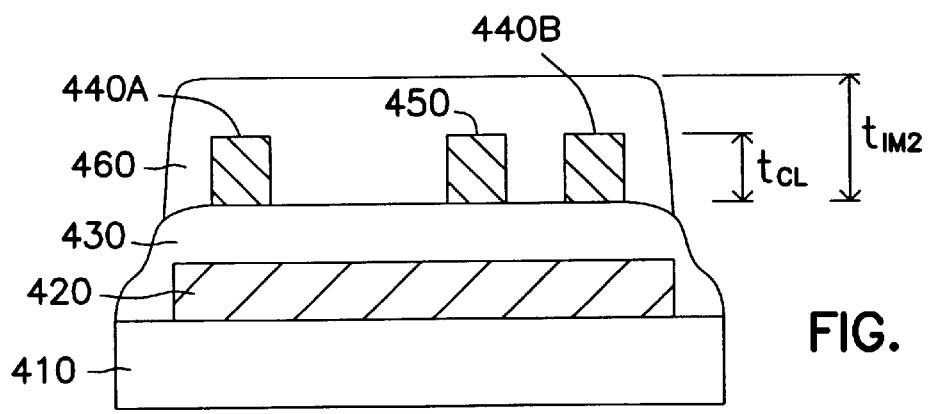

FIG. 4E illustrates the structure following the next sequence of processing. A second layer of insulating material 460 is formed on the first pair of electrically conductive lines 440A and 440B and the first transmission line 450. In one embodiment, the second layer of insulating material 460 is formed by chemical vapor deposition (CVD). In one embodiment, the second layer of insulating material 460 is an oxide layer (e.g., $SiO_2$). In an alternative embodiment, the second layer of insulating material 460 is an insulator with a lower dielectric constant than $SiO_2$. For example, a polyimide, with a dielectric constant, $\in=3$, may be deposited by spin coating followed by curing, if required by electrical design. In one embodiment of FIG. 4E, the second layer of insulating material 460 has a thickness ($t_{IM2}$) which is at least 50% greater than a thickness ($t_{CL}$) of the pair of electrically conductive lines 440A and 440B and the transmission line 450. Advantageously, this level of thickness insures step coverage at the conductor corners.

Figure 4F:
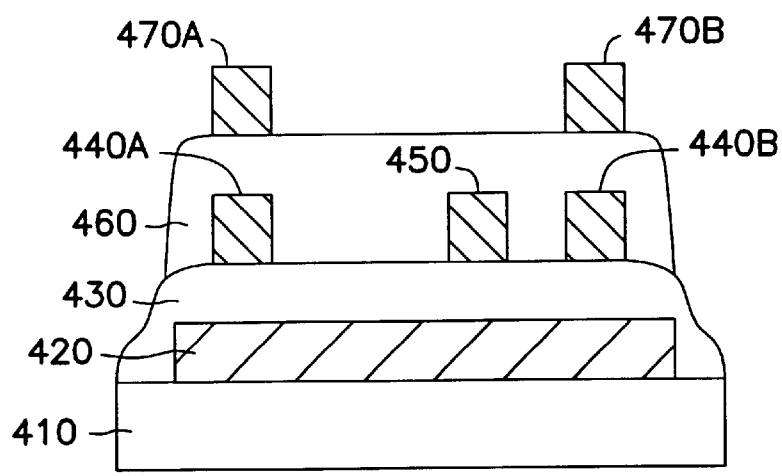

FIG. 4F illustrates the structure following the next sequence of processing. A second pair of electrically conductive lines 470A and 470B are formed on the second layer of insulating material 460. In one embodiment, the second pair of electrically conductive lines 470A and 470B have a width ($W_{CL}$) of approximately 6 to 10 μm. In another embodiment, the second pair of electrically conductive lines 470A and 470B have a thickness ($t_{TL}$) of approximately 3 μm. Similar to the processing of FIG. 4C, the second pair of electrically conductive lines 470A and 470B can be formed using optical lithography followed by an additive metallization, such as lift-off evaporation or electroplating, both of which are low-temperature processing.

Figure 4G:
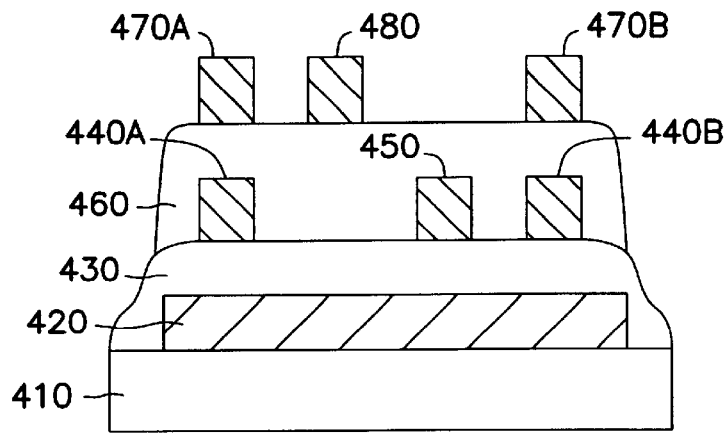

FIG. 4G illustrates the structure following the next sequence of processing. A second transmission line 480 is formed on the second layer of insulating material 460. In particular, the second transmission line 480 is formed between and in parallel with the pair of electrically conductive lines 470A and 470B. Additionally, the second transmission line 480 is formed off center of the first transmission line 450. In one embodiment, the second transmission line 480 has a width ($W_{TL}$) of approximately 6 to 10 μm. In another embodiment, the second transmission line 480 has a thickness ($t_{TL}$) of approximately 3 μm. In one embodiment, the second transmission line 480 is formed according to embodiments described in application Ser. No. 09/247,680, entitled "Current Mode Signal Interconnects and CMOS Amplifier," filed on Feb. 9, 1999. Similar to the processing of FIG. 4C, the second transmission line 480 can be formed using optical lithography followed by an additive metallization, such as lift-off evaporation or electroplating, both of which are low-temperature processing.

Figure 4H:
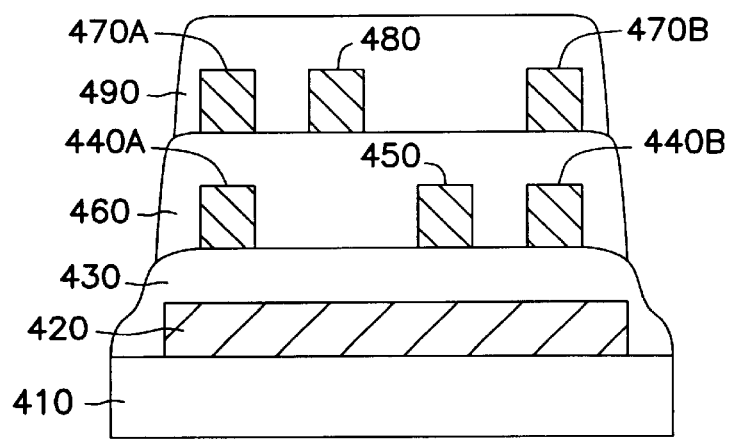

FIG. 4H illustrates the structure following the next sequence of processing. A third layer of insulating material 490 is formed on the second pair of electrically conductive lines 470A and 470B and the second transmission line 480. In one embodiment, the third layer of insulating material 490 is formed by chemical vapor deposition (CVD). In one embodiment, the third layer of insulating material 490 is an oxide layer (e.g., $SiO_2$). In an alternative embodiment, the third layer of insulating material 490 is an insulator with a lower dielectric constant than $SiO_2$. For example, a polyimide, with a dielectric constant, $\in=3$, may be deposited by spin coating followed by curing, if required by electrical design. In one embodiment of FIG. 4H, the third layer of insulating material 490 has a thickness ($t_{IM2}$) which is at least 50% greater than a thickness ($t_{CL}$) of the pair of electrically conductive lines 470A and 470B and the transmission line 480. Advantageously, this level of thickness insures step coverage at the conductor corners.

Figure 4I:
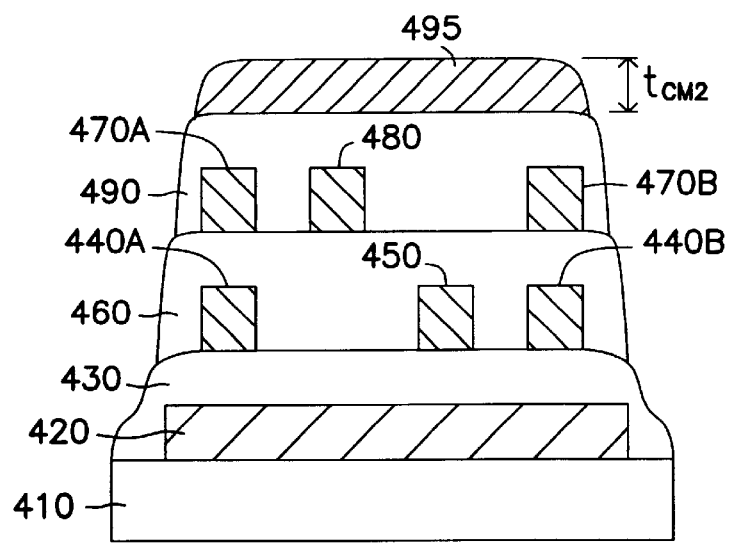

FIG. 4I illustrates the structure following the next sequence of processing. A second layer of electrically conductive material 495 is formed on the third layer of insulating material 490. The second layer of electrically conductive material 495 is formed on the third layer of insulating material 490 by depositing a conducting film of high conductivity using a technique such as evaporation, sputtering or electroplating. In one embodiment, the second layer of electrically conductive material 495 is a ground plane. In an alternative embodiment, the second layer of electrically conductive material 495 is a power plane. In a further embodiment, the second layer of electrically conductive material 495 has a thickness ($t_{CM2}$) of approximately 3 to 5 micrometers (μm). In further embodiments, the second layer of electrically conductive material 495 is coupled to a power supply or a ground potential, allowing this layer to function as a direct current (DC) bus. In one embodiment, the second layer of electrically conductive material 495 includes copper. In another embodiment, the second layer of electrically conductive material 495 includes aluminum. In still another embodiment, the second layer of electrically conductive material 495 includes any other suitably conductive material.

Figure 5:
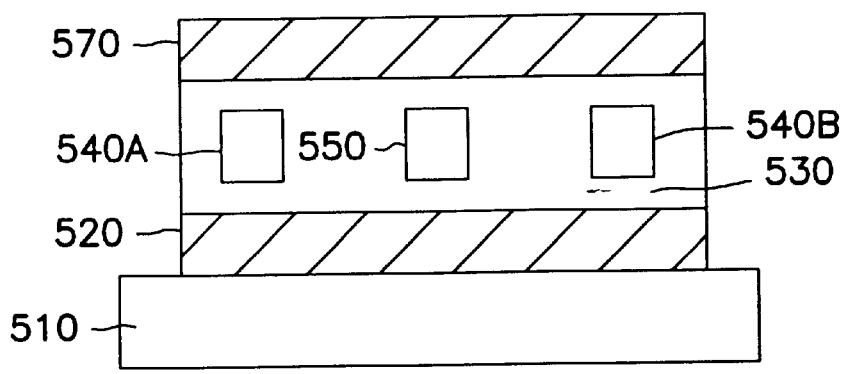
FIG. 5 is a cross-sectional view of an embodiment of a transmission line circuit according to the teachings of the present invention.

FIG. 5 is a cross-sectional view of an embodiment of a transmission line circuit according to the teachings of the present invention. The transmission line circuit of FIG. 5 is constructed in a similar manner according to any one of the methods presented in this application. The transmission line circuit includes a bottom layer of electrically conductive material 520 formed on a substrate 510. In one embodiment, the bottom layer of electrically conductive material 520 is a ground plane. In an alternative embodiment, the bottom layer of electrically conductive material 520 is a power plane. In a further embodiment, the bottom layer of electrically conductive material 520 has a thickness ($t_{CM1}$) of approximately 3 to 5 micrometers (μm). In further embodiments, the bottom layer of electrically conductive material 520 is coupled to a power supply or a ground potential, allowing this layer to function as a direct current (DC) bus. In one embodiment, the bottom layer of electrically conductive material 520 includes copper. In another embodiment, the bottom layer of electrically conductive material 520 includes aluminum. In still another embodiment, the bottom layer of electrically conductive material 520 includes any other suitably conductive material. In one embodiment, the substrate 510 is a bulk semiconductor (e.g., material from the Si, SiGe and GaAs family). In an alternative embodiment, the substrate 510 is an insulator material. In another embodiment, substrate 510 is a SOI (Silicon On Insulator) material.

The transmission line circuit of FIG. 5 also includes a layer of insulating material 530 formed on the bottom layer of electrically conductive material 520. In one embodiment, the layer of insulating material 530 is an oxide layer (e.g., $SiO_2$). In an alternative embodiment, the layer of insulating material 530 is an insulator with a lower dielectric constant than $SiO_2$. For example, a polyimide, with a dielectric constant, $\in=3$, may be deposited by spin coating followed by curing, if required by electrical design. In one embodiment, the layer of insulating material 530 has a thickness ($t_{IM1}$) of approximately 5 μm.

Additionally, the transmission line circuit of FIG. 5 also includes a pair of electrically conductive lines 540A and 540B that are formed in the layer of insulating material 530. In one embodiment, the pair of electrically conductive lines 540A and 540B have a width ($w_{CL}$) of approximately 6 to 10 μm. In another embodiment, the pair of electrically conductive lines 540A and 540B have a thickness ($t_{CL}$) of approximately 3 μm.

Transmission line circuit of FIG. 5 also includes a transmission line 550 formed in the layer of insulating material 530. In particular the transmission line 550 is formed between and parallel with the pair of electrically conductive lines 540A and 540B. In one embodiment, the transmission line 550 has a width ($W_{TL}$) of approximately 6 to 10 μm. In another embodiment, the transmission line 550 has a thickness ($t_{TL}$) of approximately 3 μm.

The transmission line circuit of FIG. 5 also includes a top layer of electrically conductive material 570 formed on the layer of insulating material 530. In one embodiment, the top layer of electrically conductive material 570 is a ground plane. In an alternative embodiment, the top layer of electrically conductive material 570 is a power plane. In a further embodiment, the top layer of electrically conductive material 570 has a thickness ($t_{CM2}$) of approximately 3 to 5 micrometers (µm). In further embodiments, the top layer of electrically conductive material 570 is coupled to a power supply or a ground potential, allowing this layer to function as a direct current (DC) bus. In one embodiment, the top layer of electrically conductive material 570 includes copper. In another embodiment, the top layer of electrically conductive material 570 includes aluminum. In still another embodiment, the top layer of electrically conductive material 570 includes any other suitably conductive material.

Figure 6:
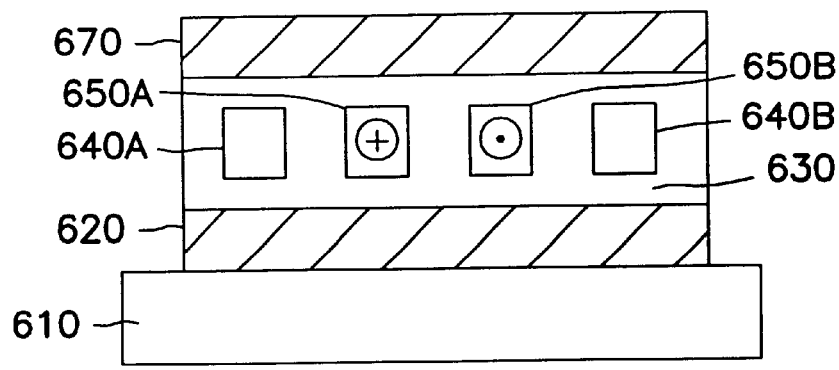
FIG. 6 is a cross-sectional view of an embodiment of a differential line circuit according to the teachings of the present invention.

FIG. 6 is a cross-sectional view of an embodiment of a differential line circuit according to the teachings of the present invention. The differential line circuit of FIG. 6 is constructed in a similar manner according to any one of the methods presented in this application. The differential line circuit includes a bottom layer of electrically conductive material 620 formed on a substrate 610. In one embodiment, the bottom layer of electrically conductive material 620 is a ground plane. In an alternative embodiment, the bottom layer of electrically conductive material 620 is a ground plane. In a further embodiment, the bottom layer of electrically conductive material 620 has a thickness ($t_{CM1}$) of approximately 3 to 5 micrometers (µm). In further embodiments, the bottom layer of electrically conductive material 620 is coupled to a power supply or a ground potential, allowing this layer to function as a direct current (DC) bus. In one embodiment, the bottom layer of electrically conductive material 620 includes copper. In another embodiment, the bottom layer of electrically conductive material 620 includes aluminum. In still another embodiment, the bottom layer of electrically conductive material 620 includes any other suitably conductive material. In one embodiment, the substrate 610 is a bulk semiconductor (e.g., material from the Si, SiGe and GaAs family). In an alternative embodiment, the substrate 610 is an insulator material. In another embodiment, the substrate 610 is a SOI (Silicon-On-Insulator) material.

The differential line circuit of FIG. 6 also includes a layer of insulating material 630 formed on the bottom layer of electrically conductive material 620. In one embodiment, the layer of insulating material 630 is an oxide layer (e.g., $SiO_2$). In an alternative embodiment, the layer of insulating material 630 is an insulator with a lower dielectric constant than $SiO_2$. For example, a polyimide, with a dielectric constant, ∈=3, may be deposited by spin coating followed by curing, if required by electrical design. In one embodiment, the layer of insulating material 630 has a thickness ($t_{IM1}$) of approximately 5 µm.

Additionally, the differential line circuit of FIG. 6 also includes a pair of electrically conductive lines 640A and 640B that are formed in the layer of insulating material 630. In one embodiment, the pair of electrically conductive lines 640A and 640B have a width ($w_{CL}$) of approximately 6 to 10 µm. In another embodiment, the pair of electrically conductive lines 640A and 640B have a thickness ($t_{CL}$) of approximately 3 µm.

The differential line circuit of FIG. 6 also includes a pair of transmission lines 650A and 650B formed in the layer of insulating material 630. In particular the pair of transmission lines 650A and 650B are formed between and parallel with the pair of electrically conductive lines 640A and 640B. In one embodiment, the pair of transmission lines 650A and 650B are adapted to conduct electronic signals in opposing directions. In one embodiment, the pair of transmission lines 650A and 650B have a width ($W_{TL}$) of approximately 6 to 10 µm. In another embodiment, the pair of transmission lines 650A and 650B have a thickness ($t_{TL}$) of approximately 3 µm.

The differential line circuit of FIG. 6 also includes a top layer of electrically conductive material 670 formed on the layer of insulating material 630. In one embodiment, the top layer of electrically conductive material 670 is a ground plane. In an alternative embodiment, the top layer of electrically conductive material 670 is a power plane. In a further embodiment, the top layer of electrically conductive material 670 has a thickness ($t_{CM2}$) of approximately 3 to 5 micrometers (µm). In further embodiments, the top layer of electrically conductive material 670 is coupled to a power supply or a ground potential, allowing this layer to function as a direct current (DC) bus. In one embodiment, the top layer of electrically conductive material 670 includes copper. In another embodiment, the top layer of electrically conductive material 670 includes aluminum. In still another embodiment, the top layer of electrically conductive material 670 includes any other suitably conductive material.

Figure 7A:
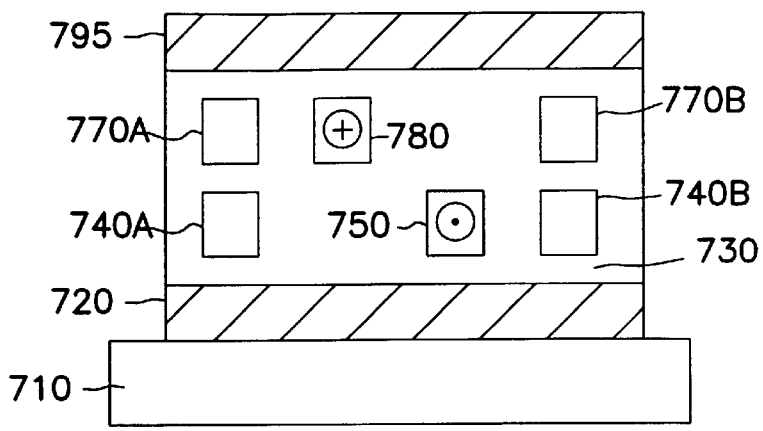
FIGS. 7A–7C are cross-sectional views of another embodiment of a twisted pair differential line circuit according to the teachings of the present invention.
Figure 7B:
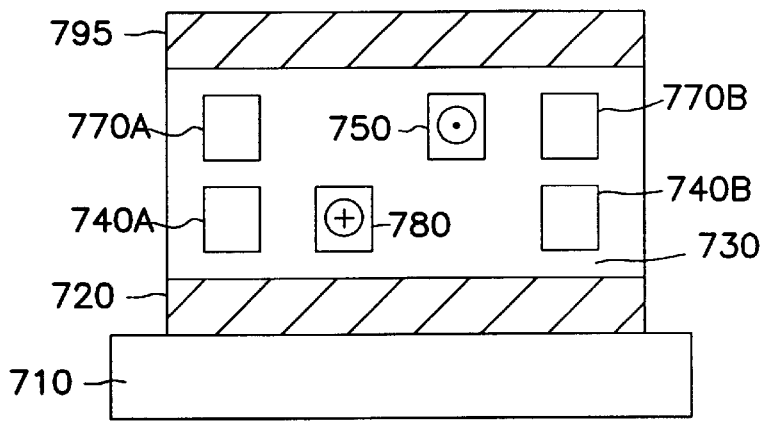
Figure 7C:
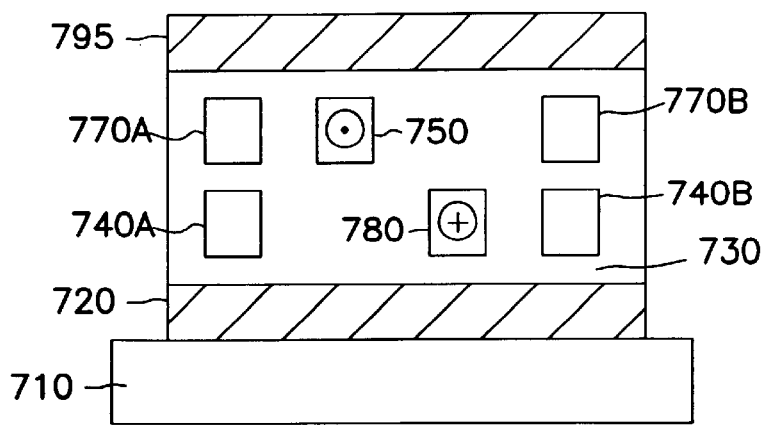

FIGS. 7A–7C are cross-sectional views of another embodiment of a twisted pair differential line circuit according to the teachings of the present invention. The twisted pair differential line circuit, illustrated in FIGS. 7A–7C, is constructed in a similar manner according to any one of the methods presented in this application. The twisted pair differential line circuit includes a bottom layer of electrically conductive material 720 formed on a substrate 710. In one embodiment, the bottom layer of electrically conductive material 720 is a ground plane. In an alternative embodiment, the bottom layer of electrically conductive material 720 is a ground plane. In a further embodiment, the bottom layer of electrically conductive material 720 has a thickness ($t_{CM1}$) of approximately 3 to 5 micrometers (µm). In further embodiments, the bottom layer of electrically conductive material 720 is coupled to a power supply or a ground potential, allowing this layer to function as a direct current (DC) bus. In one embodiment, the bottom layer of electrically conductive material 720 includes copper. In another embodiment, the bottom layer of electrically conductive material 720 includes aluminum. In still another embodiment, the bottom layer of electrically conductive material 720 includes any other suitably conductive material. In one embodiment, the substrate 710 is a bulk semiconductor (e.g., material from the Si, SiGe and GaAs family). In an alternative embodiment, the substrate 710 is an insulator material. In another embodiment, the substrate 710 is a SOI (Silicon-On-Insulator) material.

The twisted pair differential line circuit, illustrated FIGS. 7A–7C, also includes a layer of insulating material 730 formed on the bottom layer of electrically conductive material 720. In one embodiment, the layer of insulating material 730 is an oxide layer (e.g., $SiO_2$). In an alternative embodiment, the layer of insulating material 730 is an insulator with a lower dielectric constant than $SiO_2$. For example, a polyimide, with a dielectric constant, ∈=3, may be deposited by spin coating followed by curing, if required by electrical design. In one embodiment, the layer of insulating material 730 has a thickness ($t_{IM1}$) of approximately 5 µm.

Additionally, the twisted pair differential line circuit, illustrated in FIGS. 7A–7C, also includes a first pair of electrically conductive lines 740A and 740B that are formed in the layer of insulating material 730. In one embodiment, the first pair of electrically conductive lines 740A and 740B have a width ($w_{CL}$) of approximately 6 to 10 µm. In another embodiment, the first pair of electrically conductive lines 740A and 740B have a thickness ($t_{CL}$) of approximately 3 µm.

The twisted pair differential line circuit, illustrated in FIGS. 7A–7C, also includes a first transmission line 750 formed in the layer of insulating material 730. In particular the first transmission line 750 is formed between and parallel with the first pair of electrically conductive lines 740A and 740B. In one embodiment, the first transmission line 750 has a width ($w_{TL}$) of approximately 6 to 10 µm. In another embodiment, the first transmission line 750 has a thickness ($t_{TL}$) of approximately 3 µm.

Additionally, the twisted pair differential line circuit, illustrated in FIGS. 7A–7C, also includes a second pair of electrically conductive lines 770A and 770B that are formed in the layer of insulating material 730. In one embodiment, the second pair of electrically conductive lines 770A and 770B have a width ($w_{CL}$) of approximately 6 to 10 µm. In another embodiment, the second pair of electrically conductive lines 770A and 770B have a thickness ($t_{CL}$) of approximately 3 µm.

The twisted pair differential line circuit, illustrated in FIGS. 7A–7C, also includes a second transmission line 780 formed in the layer of insulating material 730. In particular the second transmission line 780 is formed between and parallel with the second pair of electrically conductive lines 770A and 770B. In one embodiment, the second transmission line 780 has a width ($w_{TL}$) of approximately 6 to 10 µm. In another embodiment, the second transmission line 780 has a thickness ($t_{TL}$) of approximately 3 µm. In one embodiment, the first transmission line 750 and the second transmission line 780 are a pair of transmission lines adapted for conducting electronic signals in opposing directions.

Figure 8A:
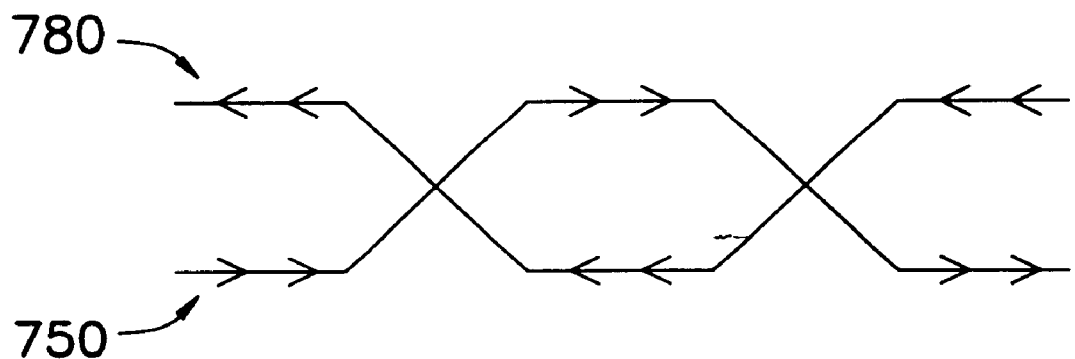
FIG. 8A is a top view of an embodiment of a differential line circuit in a twisted pair configuration according to the teachings of the present invention.
Figure 8B:
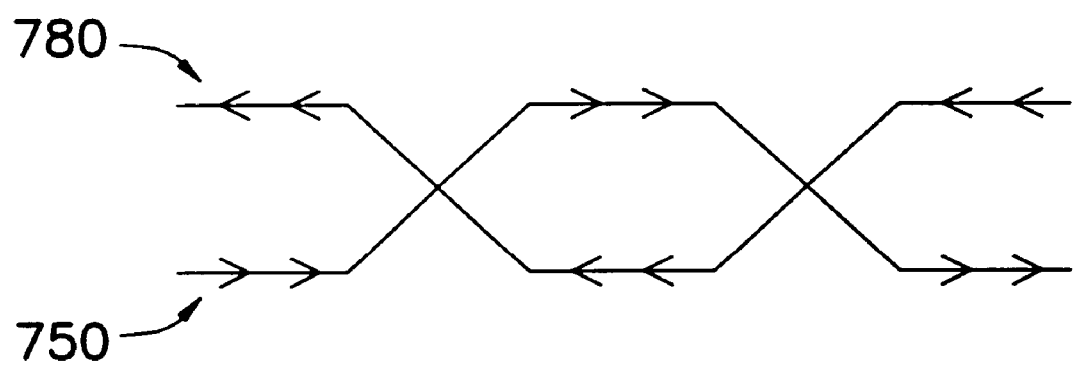
FIG. 8B is a side view of an embodiment of a differential line circuit in a twisted pair configuration according to the teachings of the present invention.

Moreover, the first transmission line 750 and the second transmission line 780 wind or twist around one another within the confines of the two pairs of electrically conductive lines (i.e., the first pair of electrically conductive lines 740A and 740B and the second pair of electrically conductive lines 770A and 770B), as illustrated in the three at different figures of FIG. 7 as well as in FIGS. 8A–8B. From different view points, FIGS. 8A–8B illustrate the way that the first transmission line 750 and the second transmission line 780 are twisted around one another. In particular, FIG. 8A illustrates a top view of the first transmission line 750 and the second transmission line 780. FIG. 8B illustrates a side view of the first transmission line 750 and the second transmission line 780.

FIGS. 7A–7C illustrate three different cross-sectional views of the twisted pair differential line circuit at different points at which the first transmission line 750 and the second transmission line 780 are twisted around each other. In particular, FIG. 7A illustrates the first transmission line 750 is located in the bottom right corner of the layer of insulating material 730 while the second transmission line 780 is located in the top left corner of the layer of insulating material 730. FIG. 7B illustrates the first transmission line 750 and the second transmission line 780 at a different point at which the two are twisted around one another. In particular, FIG. 7B illustrates the first transmission line 750 is located in the top right corner of the layer of insulating material 730 while the second transmission line 780 is located in the bottom left corner of the layer of insulating material 730. FIG. 7C illustrates the first transmission line 750 and the second transmission line 780 at a different point at which the two are twisted around one another. In particular, FIG. 7C illustrates the first transmission line 750 is located in the top left corner of the layer of insulating material 730 while the second transmission line 780 is located in the bottom right corner of the layer of insulating material 730.

The twisted pair differential line circuit, illustrated in FIGS. 7A–7C, also includes a top layer of electrically conductive material 795 formed on the layer of insulating material 730. In one embodiment, the top layer of electrically conductive material 795 is a ground plane. In an alternative embodiment, the top layer of electrically conductive material 795 is a power plane. In a further embodiment, the top layer of electrically conductive material 795 has a thickness ($t_{CM2}$) of approximately 3 to 5 micrometers (µm). In further embodiments, the top layer of electrically conductive material 795 is coupled to a power supply or a ground potential, allowing this layer to function as a direct current (DC) bus. In one embodiment, the top layer of electrically conductive material 795 includes copper. In another embodiment, the top layer of electrically conductive material 795 includes aluminum. In still another embodiment, the top layer of electrically conductive material 795 includes any other suitably conductive material.

Figure 9:
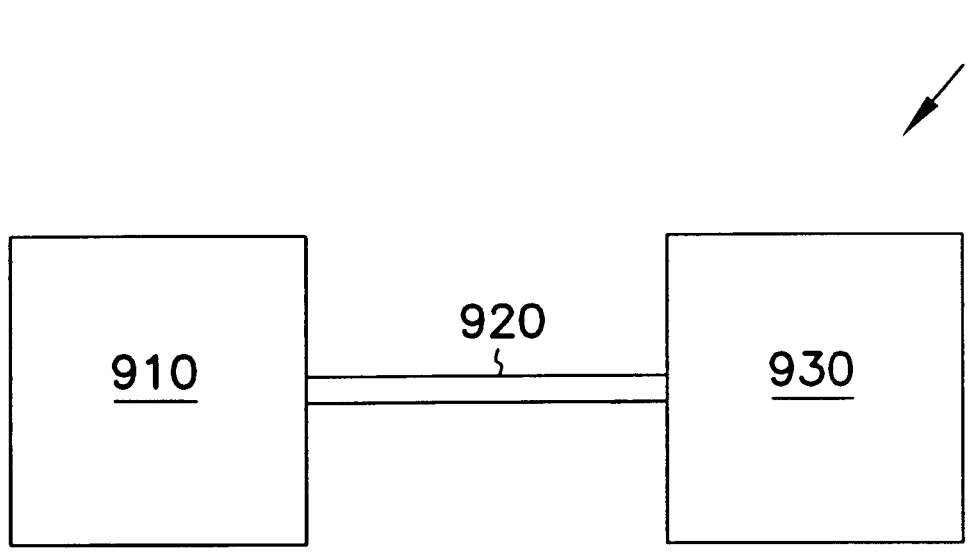
FIG. 9 is a block diagram which illustrates an embodiment of a system using line signaling according to teachings of the present invention.

FIG. 9 is a block diagram which illustrates an embodiment of a system 900 using line signaling according to teachings of the present invention. The system 900 includes a low output impedance driver 910 having a driver impedance, as is well known in the art. The low output impedance driver 910 is coupled to a transmission line circuit 920. Embodiments of the transmission line circuit 920 are described and presented above with reference to FIGS. 5–8. Moreover, the system 900 includes a termination circuit 930 having a termination impedance that is matched to the impedance of the transmission line circuit 920.

Figure 10:
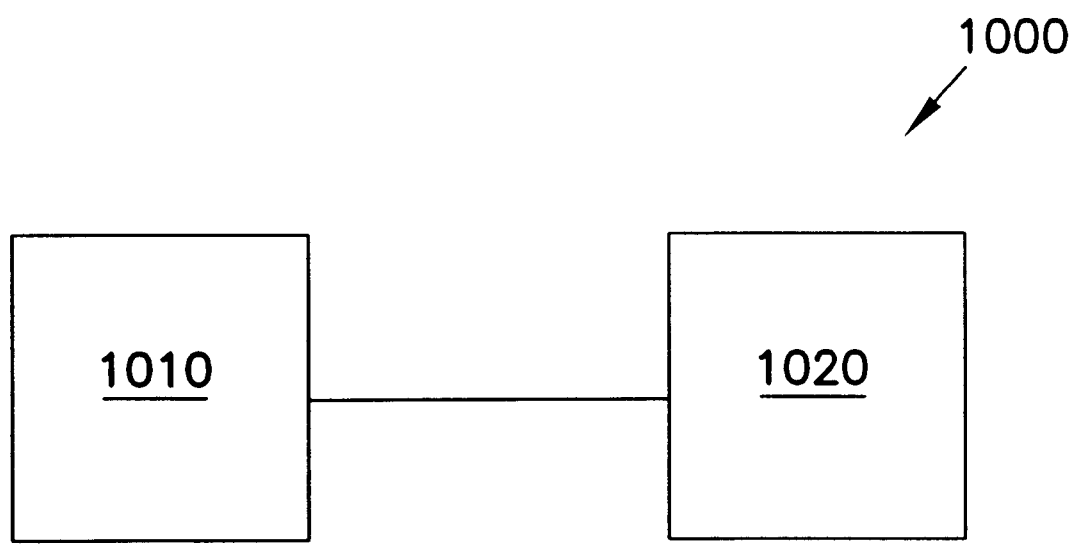
FIG. 10 is a block diagram which illustrates an embodiment of another system according to teaching of the present invention.

FIG. 10 is a block diagram which illustrates an embodiment of a system 1000 according to teaching of the present invention. The system 1000 includes an integrated circuit 1010. The integrated circuit 1010 includes the transmission line circuit described and presented above with reference to FIGS. 5–8. Additionally, the system 1000 includes a processor 1020 that is operatively coupled to the integrated circuit 1010. The processor 1020 is coupled to the integrated circuit 1010 through a system bus. In one embodiment, the processor 1020 and the integrated circuit 1010 are on the same semiconductor chip.

CONCLUSION

Thus, improved methods and structures are provided for impedance-controlled low-loss lines in CMOS integrated circuits. The present invention offers a reduction in signal delay. Moreover, the present invention further provides a reduction in skew and crosstalk. Embodiments of the present invention also provide the fabrication of improved transmission lines for silicon-based integrated circuits using conventional CMOS fabrication techniques.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. It is to be understood that the above description is intended to be illustrative, and not restrictive. Combinations of the above embodiments, and other embodiments will be apparent to those of skill in the art upon reviewing the above description. The scope of the invention includes any other applications in which the above structures and fabrication methods are used. The scope of the invention should be determined with reference to the appended claims, along with the full scope of equivalents to which such claims are entitled.

What is claimed is:

1. A transmission line circuit, comprising:
a bottom layer of electrically conductive material formed on a substrate;
a layer of insulating material formed on the bottom layer of electrically conductive material;
a pair of electrically conductive lines formed in the layer of insulating material;
a transmission line formed in the layer of insulating material and between and parallel with the pair of electrically conductive lines; and
a top layer of electrically conductive material formed on the layer of insulating material.

2. The transmission line circuit of claim 1, wherein the layer of insulating material includes oxide.

3. The transmission line circuit of claim 1, wherein the top and bottom layers of electrically conductive material have a thickness of approximately 3 to 5 micrometers ($\mu$m).

4. The transmission line circuit of claim 1, wherein the transmission line circuit is included in a Dynamic Random Access Memory (DRAM).

5. The transmission line circuit of claim 1, wherein the substrate includes a SOI (Silicon On Insulator) material.

6. The transmission line circuit of claim 1, wherein a first end of the transmission line is coupled to a low output impedance driver having a driver impedance and wherein a second end of the transmission line is coupled to a termination circuit having a termination impedance that is matched to the driver impedance.

7. The transmission line circuit of claim 1, wherein the top layer of electrically conductive material is coupled to a power supply.

8. A differential line circuit in a Dynamic Random Access Memory (DRAM), comprising:
a bottom ground plane formed on a substrate;
a layer of insulating material formed on the bottom ground plane;
a pair of electrically conductive lines formed in the layer of insulating material;
a pair of differential signal lines formed in the layer of insulating material and between and parallel with the pair of electrically conductive lines; and
a top ground plane formed on the layer of insulating material.

9. The differential line circuit of claim 8, wherein the bottom and top ground planes have a thickness of approximately 3 to 5 micrometers ($\mu$m).

10. The differential line circuit of claim 9, wherein the top and bottom ground planes include copper.

11. The differential line circuit of claim 9, wherein the pair of electrically conductive lines and the pair of differential signal lines have a width of approximately 6 to 10 $\mu$m.

12. The differential line circuit of claim 9, wherein the pair of electrically conductive lines and the pair of differential signal lines have a thickness of approximately 3 $\mu$m.

13. The differential line circuit of claim 9, wherein a first end of each of the pair of differential signal lines is coupled to a low output impedance driver having a driver impedance and wherein a second end of each of the pair of differential signal lines is coupled to a termination circuit having a termination impedance that is matched to the driver impedance.

14. The differential line circuit of claim 9, wherein the substrate includes a bulk semiconductor.

15. A transmission line circuit in a memory device, comprising:
a bottom power plane formed on a substrate;
a layer of insulating material formed on the bottom power plane;
a first pair of electrically conductive lines formed in the layer of insulating material;
a first transmission line formed in the layer of insulating material and between and parallel with the first pair of electrically conductive lines;
a second pair of electrically conductive lines formed in the layer of insulating material;
a second transmission line formed in the layer of insulating material, and between and parallel with the second pair of electrically conductive lines and off center with the first transmission line, wherein the first transmission line and the second transmission line are twisted around each other; and
a top power plane formed on the layer of insulating material.

16. The transmission line circuit of claim 15, wherein the top and bottom power planes have a thickness of approximately 3 to 5 micrometers ($\mu$m).

17. The transmission line circuit of claim 15, wherein the top and bottom power planes include copper.

18. The transmission line circuit of claim 15, wherein the top power plane is coupled to a power supply.

19. An electronic system comprising:
a processor; and
an integrated circuit coupled to the processor, the integrated circuit including:
a bottom layer of electrically conductive material formed on a substrate
a layer of insulating material formed on the bottom layer of electrically conductive material;
a pair of electrically conductive lines formed in the layer of insulating material;
a transmission line formed in the layer of insulating material and between and parallel with the pair of electrically conductive lines; and
a top layer of electrically conductive material formed on the layer of insulating material.

20. The electronic system of claim 19, wherein the layer of insulating material includes oxide.

21. The electronic system of claim 19, wherein the top and bottom layers of electrically conductive material have a thickness of approximately 3 to 5 micrometers ($\mu$m).

22. The electronic system of claim 19, wherein the top layer of electrically conductive material is coupled to a power supply.

23. The electronic system of claim 19, wherein the substrate includes an insulator material.

24. An electronic system comprising:
a processor; and
a memory chip coupled to the processor through a system bus, the memory chip including:
a bottom ground plane formed on a substrate;
a layer of insulating material formed on the bottom ground plane;
a pair of electrically conductive lines formed in the layer of insulating material;
a pair of integrated circuit lines formed in the layer of insulating material and between and parallel with the pair of electrically conductive lines; and a top ground plane formed on the layer of insulating material.

25. The electronic system of claim 24, wherein the bottom and top ground planes have a thickness of approximately 3 to 5 micrometers ($\mu$m).

26. The electronic system of claim 24, wherein the top and bottom ground planes include copper.

27. The electronic system of claim 24, wherein the pair of electrically conductive lines and the pair of integrated circuit lines have a width of approximately 6 to 10 $\mu$m.

28. The electronic system of claim 24, wherein the pair of electrically conductive lines and the pair of integrated circuit lines have a thickness of approximately 3 $\mu$m.

29. The electronic system of claim 24, wherein the substrate includes a SOI (Silicon On Insulator) material.

30. An electronic system comprising:

processor; and a Dynamic Random Access Memory (DRAM) coupled to the processor through a system bus, the DRAM including:
  a bottom power plane formed on a substrate;
  a layer of insulating material formed on the bottom power plane;
  a first pair of electrically conductive lines formed in the layer of insulating material;
  a first transmission line formed in the layer of insulating material and between and parallel with the first pair of electrically conductive lines;
  a second pair of electrically conductive lines formed in the layer of insulating material;
  a second transmission line formed in the layer of insulating material, and between and parallel with the second pair of electrically conductive lines and off center with the first transmission line, wherein the first transmission line and the second transmission line are twisted around each other; and
  a top power plane formed on the layer of insulating material.

31. The electronic system of claim 30, wherein the substrate includes a bulk semiconductor.

32. The electronic system of claim 30, wherein forming the top and bottom power planes include aluminum.

33. An integrated circuit comprising:

an embedded conductor in an insulator on a semiconductor wafer; and a plurality of embedded conductive surfaces in the insulator layer surrounding the embedded conductor.

* * * * *

UNITED STATES PATENT AND TRADEMARK OFFICE
CERTIFICATE OF CORRECTION

PATENT NO.   : 6,373,740 B1  
DATED        : April 16, 2002  
INVENTOR(S)  : Leonard Forbes, Eugene H. Cloud and Kie Y. Ahn It is certified that error appears in the above-identified patent and that said Letters Patent is hereby corrected as shown below:

<u>Title page,</u>  
Item [56], OTHER PUBLICATIONS, delete "." after "Circuits" and insert -- , --, therefor.

<u>Column 7,</u>  
Line 9, delete "application" and insert -- Application --, therefor.

<u>Column 8,</u>  
Line 61, delete "application" and insert -- Application --, therefor.

<u>Column 9,</u>  
Line 21, delete "a" before "second", therefor.  
Line 25, delete "A" after "of", therefor.

<u>Column 10,</u>  
Line 16, delete "Si0$_2$" and insert -- SiO$_2$ --, therefor.

<u>Column 15,</u>  
Line 40, delete "at" after "three", therefor.

<u>Column 16,</u>  
Line 35, delete "teaching" and insert -- teachings --, therefor.

Signed and Sealed this

Twenty-fourth Day of June, 2003

JAMES E. ROGAN  
*Director of the United States Patent and Trademark Office*